United States Patent [19]

Zabler

[11] Patent Number: 4,727,323

[45] Date of Patent: Feb. 23, 1988

[54] MAGNETO-RESISTIVE DIFFERENTIAL SENSOR SYSTEM

[75] Inventor: Erich Zabler, Stutensee-B, Fed. Rep. of Germany

[73] Assignee: Robert Bosch GmbH, Stuttgart, Fed. Rep. of Germany

[21] Appl. No.: 781,957

[22] Filed: Sep. 30, 1985

[30] Foreign Application Priority Data

Sep. 29, 1984 [DE] Fed. Rep. of Germany ....... 3435867

[51] Int. Cl.$^4$ .................. G01R 33/02; G01B 7/14; H01L 43/08
[52] U.S. Cl. ................................ 324/252; 324/208; 338/32 R
[58] Field of Search ............... 324/207, 208, 252; 338/32 R

[56] References Cited

U.S. PATENT DOCUMENTS

| | | | |
|---|---|---|---|
| 3,286,161 | 11/1966 | Jones et al. | 338/32 R |
| 3,341,772 | 9/1967 | Weiss | 324/252 |
| 4,616,281 | 10/1986 | Nakamura | 324/252 |

Primary Examiner—Reinhard J. Eisenzopf
Assistant Examiner—Walter E. Snow
Attorney, Agent, or Firm—Frishauf, Holtz, Goodman & Woodward

[57] ABSTRACT

A differential field plate or magnetically responsive resistors (4a, 4b) is so connected that two field plate resistors are serially connected and the common junction (J) thereof is connected to ground or, chassis; the output is taken across the free terminals of the resistance elements (4a, 4b), the resistance elements having a constant current applied thereto. The current is maintained constant for any particular temperature by a closed connecting loop including a comparator (22) comparing the voltage across any one of the field plate resistors ($U_A^*$) with a predetermined voltage ($U_o$). Noise or disturbance voltages ($U_{St1}$, $U_{St2}$) are balanced out by the circuit and thus will not affect the output voltage derived across the free terminals of the field plate resistors (4a, 4b).

4 Claims, 3 Drawing Figures

MAGNETO-RESISTIVE DIFFERENTIAL SENSOR SYSTEM

The present invention relates to a magneto-resistive or magnetostrictive differential sensor system in which a pair of resistance elements are provided which change resistance upon exposure to a changing magnetic field.

BACKGROUND

Sensor elements which operate on the basis of magnetic influence on elements which change their resistance upon change of a magnetic field to which they are exposed are known—see, for example, the referenced textbook, Siemens Data Book, Vol. 1, chapter on "Sensors", particularly pages 60–69. Sensors of this type have two magnetic field resistors which are serially connected to a source of direct current. The sensor voltage is tapped off at the junction of the two resistors.

THE INVENTION

It is an object to provide a sensor system which has a higher output voltage than heretofore available.

Briefly, the common junction of the magnetically responsive resistance elements is connected to a reference for example a ground or chassis point. A current supply means is connected to the respective free terminals of the pair of resistance elements to supply a current thereto which, at any temperature, is constant. The output sensing voltage is obtained by coupling the output to the free terminals of the resistance elements.

The sensor system in accordance with the present invention has the advantage with respect to prior art sensors that, with otherwise all conditions being identical, the sensor output voltage is double that previously obtained. This permits use of the sensor elements in environments which have a wider air gap than previously possible. The sensor system in accordance with the present invention, additionally, is essentially immune to noise and disturbance signals which may be coupled to the sensor system by the supply lines thereto, since such noise or disturbance signals, as far as the sensor element output voltage is concerned, effectively cancel each other. Thus, the sensor system is more reliable and the output voltage requires less processing.

Connecting the center of the pair of sensor resistors to reference potential permits connecting this center tap to a housing which, additionally, is connected to ground or chassis. Thus, a connector line in the supply cable can be saved. Any disturbance which might be coupled to the sensor elements due to erroneous reference voltage, coupled to the sensor elements by ground or chassis currents is eliminated by the differential evaluation of the output from the ungrounded sensor element terminals.

DRAWINGS

DETAILED DESCRIPTION

Figure 1:
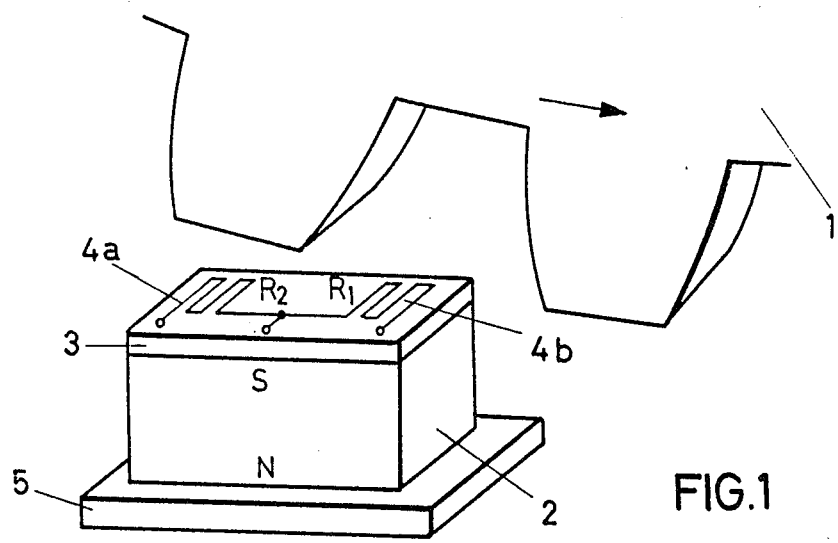
FIG. 1 is a general schematic and partly perspective view of the construction of a differential field plate sensor system.

FIG. 1 shows the principal arrangement of a differential sensor system. A gear-like rotor 1 is magnetically coupled to a stator. The stator has a permanent magnet 2, a substrate 3, for example of ferrite, and magnetic field plate resistors 4a, 4b thereon forming the sensor elements. A magnetic return yoke 5, for example of soft iron, is provided.

BASIC OPERATION

Upon rotation of the rotor, the flux of the magnetic field from the permanent magnet through the resistors 4a, 4b will change, so that the resistor elements 4a, 4b will change their resistance values in accordance with change of flux.

Figure 2:
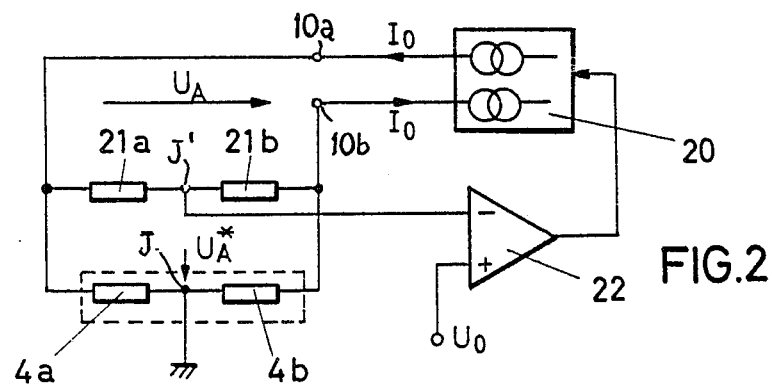
FIG. 2 is the equivalent circuit diagram of the sensor system, connected to current sources.

The electrical equivalent circuit and connection of the resistors 4a, 4b is shown in FIG. 2.

The resistor pair 4a, 4b are connected to a common junction J which, in turn, is connected to ground or chassis or, in other words, to a reference voltage point. The free terminals of the resistor pair 4a, 4b are connected to a double current source 20, which provides a constant current $I_o$ to the resistor pair 4a, 4b. The current is constant for a constant temperature, changing in value only, as a function of temperature-dependent resistance changes of the resistors 4a, 4b, and such other components as are connected to the circuit in accordance with well known and standard temperature compensation technology. The output voltage $U_A$ is taken across the free terminals 10a, 10b of the resistor pair 4a, 4b. The output voltage will vary, with a frequency representative of the speed of the rotor, and proportional thereto.

A high resistance voltage divider, built of two equal resistors 21a, 21b is also connected across the terminals 10a, 10b.

The voltage $U_A^*$ is tapped off between the junction J' of the resistor pair 21a, 21b forming a voltage divider; the voltage $U_A^*$ could also be picked off the junction J. This voltage is connected to a comparator 22, to be compared therein with a constant reference voltage $U_o$. Deviation of the voltage $U_A^*$ from the voltage $U_o$ is connected to the constant current source 20 as a control signal to control the level or value of the current $I_o$ by controlling the current source 20 in accordance with well kown current control technology. The voltage $U_o$ is the maximum permissible average supply voltage of the field plates 4a, 4b at which, within their operating range, the current through the field plate resistors 4a, 4b will not thermally overload the resistors 4a, 4b. Control of the current $I_o$, with respect to temperature, is necessary in order to compensate the influence on resistance due to temperature variations. Control is so effected that, regardless of temperatures, and in quiescent condition, each one of the field plates will have the voltage $U_o$ thereacross. Upon drop in resistance, the current is then suitably raised. The output voltage then will be in accordance with the relationship:

$$U_A = U_o \cdot \frac{\Delta R}{R} \tag{1}$$

wherein R is the quiescent resistance of the field plates 4a, 4b, respectively, and $\Delta R$ is the change in resistance upon change of magnetic field as the rotor 1 rotates, with the teeth or gaps, respectively, passing over the field plates.

Figure 3:
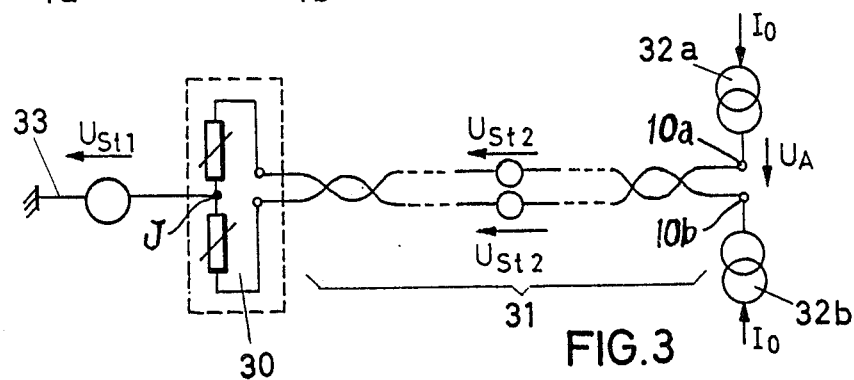
FIG. 3 is a diagram similar to FIG. 2, in which disturbance voltages are additionally indicated and used in connection with the explanation of the invention and how disturbance effects are eliminated.

FIG. 3 illustrates, schematically, how disturbance voltages are eliminated. The sensor 30, which can be identical to the sensor shown in FIG. 1, is connected over supply lines 31 with the current sources 32a, 32b, which correspond to the current source 20 of FIG. 2. Additionally, disturbance and noise voltage sources $U_{St1}$ and $U_{St2}$ are shown, schematically indicating the influence of noise voltages on the respective connection lines. The supply lines 31, as well as the chassis or ground line 33, may have disturbance voltages, schematically shown by the sources $U_{St1}$ and $U_{St2}$ applied thereto. Since there disturbance voltages are coupled to the sensor in the form of similar in-phase signals, they are eliminated from the sensor output voltage across the terminals 10a, 10b by cancelling each other.

I claim:

1. Magneto-resistive differential sensor system comprising
    a pair of resistance elements (4a, 4b) which change resistance upon exposure to a changing magnetic field, said pair of resistance elements being serially connected and having a common junction (J) and, each, a free terminal,
    the common junction (J) of the resistance elements (4a, 4b) being connected to ground, or chassis;
    current supply means (20, 32a, 32b) connected to supply electrical current to the resistance elements;
    said current supply means including control means (21a, 21b; J'; 22) including comparator means (22), controlling the current supply means (20) to provide a constant predetermined voltage across the respective resistance elements when the resistance elements are in quiescent condition and not exposed to a magnetic field,
    said current supply means (20, 32a, 32b) being connected to the respective free terminals of the resistance elements and supplying a current ($I_o$) to each of the resistance elements which, at a constant temperature, is a constant current;
    sensor voltage connection means (10a, 10b) coupled to the free terminals of the resistance elements (4a, 4b) for obtaining an output sensing voltage ($U_A$) across said free terminals sensing voltage changes upon exposure of said resistance elements (4a, 4b) to a changing magnetic field; and
    a high resistance voltage divider comprising a pair of equal resistors (21a, 21b) connected across the free terminals of the magnetically responsive resistance elements (4a, 4b);
    said comparator means (22), being connected for comparing the voltage from the center or tap point (J') of the voltage divider formed by the high resistance resistors (21a, 21b) and ground or chassis with a constant predetermined voltage and being connected to further control the current supply means (20; 32a, 32b) to provide current at an output voltage thereacross which compensates for deviation of voltage at said center or tap point from the constant predetermined voltage upon exposure of said resistance elements (4a, 4b) to a changing magnetic field.

2. Sensor according to claim 1, wherein the current ($I_o$) has an inverse temperature dependence with respect to the temperature resistance dependence of the magnetically responsive resistance elements (4a, 4b).

3. Sensor according to claim 1, wherein the current supply means comprises two current sources (32a, 32b) each connected to a free terminal of the magnetically responsive resistance element (4a, 4b).

4. Sensor according to claim 1, wherein the current supply means comprises a double current supply source (20; 32a; 32b) and
    each of the free terminals of the magnetically responsive resistance elements (4a, 4b) is connected to a respective output terminal of the double current supply source (20; 32a, 32b).

* * * * *